United States Patent
Harden et al.

(10) Patent No.: US 6,406,583 B1
(45) Date of Patent: *Jun. 18, 2002

(54) WAFER LEVEL CREATION OF MULTIPLE OPTICAL ELEMENTS

(75) Inventors: Brian Harden; Alan Kathman; Michael Feldman, all of Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/514,252

(22) Filed: Feb. 28, 2000

Related U.S. Application Data

(63) Continuation of application No. 08/943,274, filed on Oct. 3, 1997, now Pat. No. 6,096,155, which is a continuation-in-part of application No. 08/917,865, filed on Aug. 27, 1997, now Pat. No. 6,281,134, which is a continuation-in-part of application No. 08/727,837, filed on Sep. 27, 1996, now Pat. No. 5,771,218.

(51) Int. Cl.[7] .................... B32B 31/18; H01L 21/78; G11B 7/00
(52) U.S. Cl. .................... 156/250; 156/291; 156/297; 156/299; 369/112
(58) Field of Search ................ 156/250, 299, 156/300, 560, 265, 291, 297; 438/460; 369/112, 44.12, 103, 109; 257/98; 385/91, 89, 88, 37, 14

(56) References Cited

U.S. PATENT DOCUMENTS

| | | | |
|---|---|---|---|
| 3,579,816 A | 5/1971 | Ingraham | 438/109 |
| 3,674,004 A | 7/1972 | Grandia et al. | 125/16.01 |
| 3,691,707 A | 9/1972 | Von Arx et al. | 451/541 |
| 3,698,080 A | 10/1972 | Berner | 438/109 |
| 4,769,108 A | 9/1988 | Deppe et al. | 438/464 |
| 5,034,083 A | 7/1991 | Campanelli et al. | 156/273.5 |
| 5,157,001 A | 10/1992 | Sakuma | 438/465 |
| 5,182,055 A | 1/1993 | Allison et al. | 156/273.3 |
| 5,214,535 A | 5/1993 | Harries et al. | 359/865 |
| 6,096,155 A * | 8/2000 | Harden et al. | 156/250 |
| 6,235,141 B1 * | 5/2001 | Feldman et al. | 156/250 |

FOREIGN PATENT DOCUMENTS

EP  0 731 417 A  9/1996

* cited by examiner

Primary Examiner—Linda Gray
(74) Attorney, Agent, or Firm—Susan S. Morse

(57) ABSTRACT

Integrated multiple optical elements may be formed by bonding substrates containing such optical elements together or by providing optical elements on either side of the wafer substrate. The wafer is subsequently diced to obtain the individual units themselves. The optical elements may be formed lithographically, directly, or using a lithographically generated master to emboss the elements. Alignment features facilitate the efficient production of such integrated multiple optical elements, as well as post creation processing thereof on the wafer level.

29 Claims, 4 Drawing Sheets

WAFER LEVEL CREATION OF MULTIPLE OPTICAL ELEMENTS

CROSS REFERENCES TO RELATED APPLICATIONS

This application is a continuation of application Ser. No. 08/943,274, filed Oct. 3, 1997, now U.S. Pat. No. 6,096,155; which is a continuation-in-part of application Ser. No. 08/727,837, filed Sep. 27, 1996, now U.S. Pat. No. 5,771,218; which is a continuation-in-part of application Ser. No. 08/917,865, filed Aug. 27, 1997, now U.S. Pat. 6,128,134.

FIELD OF THE INVENTION

The present invention is directed to integrating multiple optical elements on a wafer level. In particular, the present invention is directed to efficient creation of integrated multiple elements.

BACKGROUND OF THE INVENTION

As the demand for smaller optical components to be used in a wider variety of applications increases, the ability to efficiently produce such optical elements also increases. In forming such integrated multiple optical elements at a mass production level, the need for accurate alignment increases. Further, such alignment is critical when integrating more than one optical element.

Integrated multiple optical elements are multiple optical elements stacked together along the z-axis, i.e., the direction of the light propagation. Thus, light travelling along the z-axis passes through the multiple elements sequentially. These elements are integrated such that further alignment of the elements with themselves is not needed, leaving only the integrated element to be aligned with a desired system, typically containing active elements.

Many optical systems require multiple optical elements. Such required multiple optical elements include multiple refractive elements, multiple diffractive elements and refractive/diffractive hybrid elements. Many of these multiple element systems were formed in the past by bonding individual elements together or bonding them individually to an alignment structure.

In bulk or macroscopic optics to be mounted in a machined alignment structure formed using a mechanical machining tools, the typical alignment precision that can be achieved is approximately 25–50 microns. To achieve a greater level of 15–25 microns, active alignment is required. Active alignment typically involves turning on a light source, e.g., a laser, and sequentially placing each optic down with uncured ultra-violet (UV) adhesive. Then each part is moved, usually with a translation stage, until the appropriate response from the laser is achieved. Then the part is held in place and the epoxy is cured with UV light, thereby mounting the element. This is done sequentially for each element in the system.

Alignment accuracies of less than 15 microns for individual elements can be achieved using active alignment, but such accuracies greatly increase the amount of time spent moving the element. This increase is further compounded when more than one optical element is to be aligned. Thus, such alignment accuracy is often impractical even using active alignment.

In many newer applications of optics, as in the optical head configuration set forth in commonly assigned co-pending application Ser. No. 08/727,837, which is hereby incorporated by reference, and the integrated beam shaper application noted above, there is a need to make optical systems composed of several micro-optical components and in which the tolerances needed are much tighter than can be achieved with conventional approaches. In addition to requiring tight tolerances, elements of lower cost are also demanded. The alignment tolerance needed may be 1 micron to 5 microns, which is very expensive to achieve with conventional methods.

To achieve greater alignment tolerances, passive alignment techniques have been used as set forth in U.S. Pat. No. 5,683,469 to Feldman entitled "Microelectronic Module Having Optical and Electrical Interconnects". One such passive alignment technique is to place metal pads on the optics and on the laser and place solder between them and use self-alignment properties to achieve the alignment. When solder reflows, surface tension therein causes the parts to self-align. However, passive alignment has not been employed for wafer-to-wafer alignment. In particular, the high density of solder bumps required and the thickness and mass of the wafer make such alignment impractical.

Another problem in integrating multiple optical elements formed on separate wafers at a wafer level arises due to the dicing process for forming the individual integrated elements. The dicing process is messy due to the use of a dicing slurry. When single wafers are diced, the surfaces thereof may be cleaned to remove the dicing slurry. However, when the wafers are bonded together, the slurry enters the gap between the wafers. Removing the slurry from the gap formed between the wafers is quite difficult.

Integrated elements are also sometimes made by injection molding. With injection molding, plastic elements can be made having two molded elements located on opposite sides of a substrate. Multiple plastic elements can be made simultaneously with a multi-cavity injection molding tool.

Glass elements are also sometimes made by molding, as in U.S. Pat. No. 4,883,528 to Carpenter entitled "Apparatus for Molding Glass Optical Elements". In this case, just as with plastic injection molding, multiple integrated elements are formed by molding two elements on opposite sides of a substrate. Glass molding however has disadvantages of being expensive to make tooling and limited in size that can be used.

To make optics inexpensive, replication techniques are typically used. In addition to plastic injection molding and glass molding discussed above, individual elements may also be embossed. An example of such embossing may be found in U.S. Pat. No. 5,597,613 to Galarneau entitled "Scale-up Process for Replicating Large Area Diffractive Optical Elements". Replicated optics have not been used previously together with solder self-alignment techniques. For each replication method, many individual elements are generated as inexpensively as possible.

Such replication processes have not been used on a wafer level with subsequent dicing. This is primarily due to the stresses imposed on the embossed layer during dicing. When using embossing on a wafer level, unique problems, such as keeping the polymer which has been embossed sufficiently attached to the substrate, e.g., such that the alignment, especially critical on the small scale or when integrating more than one element, is not upset.

Further, these replication processes are not compatible with the wafer level photolithographic processes. In particular, replication processes do not attain the required alignment accuracies for photolithographic processing. Even if embossing was compatible with lithographic processing, it would be too expensive to pattern lithographically on one element at a time. Further, the chemical processing portion of lithographic processing would attack the embossing material.

Other problems in embossing onto plastic, as is conventionally done, and lithographic processing arise. In particular, the plastic is also attacked by the chemicals used in lithographic processing. Plastic also is too susceptible to warping due to thermal effects, which is detrimental to the alignment required during lithographic processing.

SUMMARY OF THE INVENTION

Considering the foregoing background, it is an object of the present invention to efficiently produce integrated multiple optical elements. Such efficient production is accomplished by forming the integrated multiple optical elements on a wafer level.

It is further an object of the present invention to address the problems arising when attempting to achieve such wafer level production of integrated multiple optical elements. These problems include ensuring accurate alignment, allowing precise dicing of the wafer to the constituent integrated multiple optical elements when more than one wafer is bonded together, and providing additional features for allowing easy incorporation of the integrated multiple optical element into an overall system for a desired application.

It is another object of the present invention to provide embossing which has sufficient alignment for use with photolithographic features and sufficient adhesion to withstand dicing.

These and other objects of the present invention will become more readily apparent from the detailed description given hereinafter. However, it should be understood that the detailed description gives specific examples, while indicating the preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
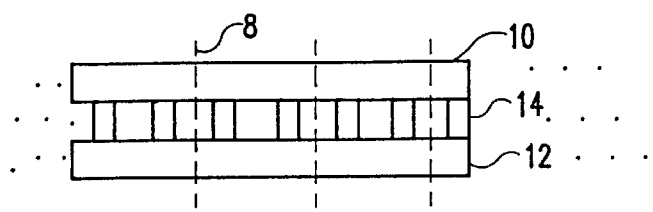
FIG. 1 illustrates a first embodiment for bonding together two wafers.

As can be seen in FIG. 1, a first substrate wafer 10 and a second substrate wafer 12 are to be bonded together in order to provide integrated multiple optical elements. A wafer is a disc, typically 4, 6, 8, or 12 inches in diameter and typically having a thickness between 400 microns and 6 mm.

These wafers have an array of respective optical elements formed thereon on either one or both surfaces thereof. The individual optical elements may be either diffractive, refractive or a hybrid thereof. Dashed lines 8 indicate where the dicing is to occur on the wafers to provide the individual integrated elements.

A bonding material 14 is placed at strategic locations on either substrate in order to facilitate the attachment thereof. By surrounding the optical elements which are to form the final integrated die, the adhesive 14 forms a seal between the wafers at these critical junctions. During dicing, the seal prevents dicing slurry from entering between the elements, which would result in contamination thereof. Since the elements remain bonded together, it is nearly impossible to remove any dicing slurry trapped therebetween. The dicing slurry presents even more problems when diffractive elements are being bonded, since the structures of diffractive elements tend to trap the slurry.

Preferably, an adhesive or solder can be used as the bonding material 14. Solder is preferable in many applications because it is smoother than adhesives and allows easier movement prior to bonding. Adhesives have the advantages of being less expensive for a number of applications, they can be bonded with or without heating, they do not suffer with oxidation, and they can be transparent.

When using a fluid adhesive as the bonding material, the viscosity of the fluid adhesive is important. The adhesive cannot be too thin, or else it beads, providing indeterminant adhesion, allowing the dicing slurry to get in between the elements on the wafers, thereby contaminating the elements. The adhesive cannot be too thick, or the restoring force is too great and sufficient intimate contact between the substrates 10 and 12 to be bonded is not achieved. The fluid adhesive preferably has a viscosity between 1,000 and 10,000 centipoise. Satisfactory epoxies include Norland 68 and Masterbond UV 15-7.

When a fluid adhesive is employed, it must be provided in a controlled manner, such as ejected from a nozzle controlled in accordance with the desired coordinates to receive the fluid adhesive. After alignment of the wafers, the entire assembly is cured, thereby hardening the fluid adhesive and completing the bonding.

When solder is used, an electroplating or sputtering process may be employed. For example, a masking material may be put over the substrate wherever the substrate is not to have solder. Then the entire wafer is placed into a bath or sputtering chamber. Then solder is placed over the entire wafer and the masking material is pulled off, leaving solder where there was no masking material. Once the wafers are appropriately aligned, the solder is then heated up to reflow. The solder is cooled and allowed to re-harden, thereby completing the bond.

When using the bonding material used alone as shown in FIG. 1 is a fluid adhesive, a more viscous adhesive is needed in order to ensure that the bonding material remains where it is deposited. Even using a viscous adhesive, the adhesive still typically spreads over a relatively large area, resulting in a need for a larger dead space between elements to be integrated to accommodate this spread without having the adhesive interfere with the elements themselves.

It is also difficult to control the height of the adhesive when the adhesive is used alone. This results in the amount of adhesive being overcompensated and the height of the adhesive, and hence the separation between the wafers, often being greater than desired. The difficulty controlling the height of the adhesive also results in air being trapped within the space containing the optical elements. This arises from the uncertainty as to the height and the timing of when a vacuum is pulled on the wafer pair. This air is undesirable, as it may expand upon heating and disrupt the bond of the elements.

Figure 2:
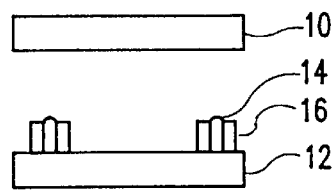
FIG. 2 illustrates a second embodiment for bonding together two wafers.

Therefore, an advantageous alternative is shown in FIG. 2, in which only an individual integrated optical element of the wafer is shown. Stand offs 16 for each element to be integrated are etched or replicated into the bottom substrate wafer 12 at the same time the array of optical elements are made for the substrate wafer 12, and typically will be of the same material as the substrate wafer. These stand offs 16 preferably include a trench formed between two surfaces in which the adhesive 14 is to be placed. These trenches then provide precise spacing between the substrates to be bonded and provide more of a bonding surface to which the adhesive 14 can adhere. This increased surface area also reduces beading problems.

When solder is used as the bonding material 14, solid stand-offs are preferably used to provide the desired separation between the wafers. The solder is then deposited in a thin, e.g., 4–5 micron, layer on top of the stand-offs. While the solder could be used alone as shown in FIG. 1, it is more feasible and economical to use the solder in conjunction with stand-offs.

The use of the stand-offs allows a more uniform and predictable height to be obtained, resulting in less air being trapped between the bonded elements. A vacuum may now be pulled just before or at contact between the bonding material and the other substrate, due to the reduction in variability of the separation.

The substrate not containing the stand-offs may have notches formed thereon to receive the stand-offs 16 therein. These notches can be formed at the same time any optical elements on that surface are formed. In such a configuration, the stand-offs 16 and the corresponding notches will serve as alignment features, facilitating alignment of the wafers to one another.

Figure 3A:
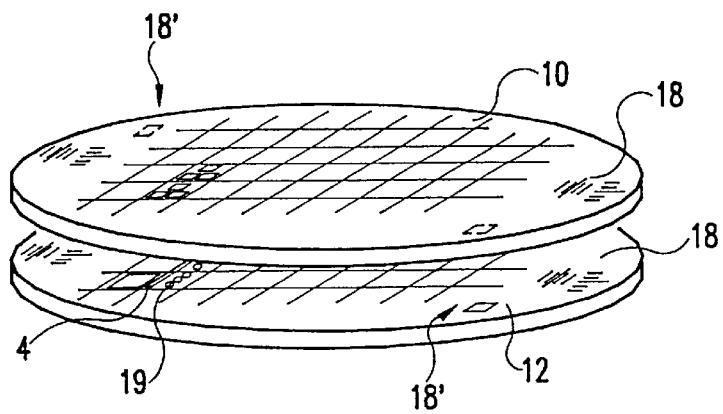
FIG. 3a is a perspective view illustrating wafers to be bonded.

FIG. 3a shows the two substrates 10 and 12 prior to being bonded and diced. The individual optical elements 19 to be integrated may consist of one or more optical elements. Further, the optical elements on the wafers may be identical, or may differ from one another. Prior to joining the wafers 10, 12, the bonding material 14 is placed on at least one of the wafers in the manner described above. Advantageously, both substrates 10 and 12 include fiducial marks 18 somewhere thereon, most likely at an outer edge thereof, to ensure alignment of the wafers so that all the individual elements thereon are aligned simultaneously. Alternatively, the fiducial marks 18 may be used to create mechanical alignment features 18' on the wafers 11, 12. One or both of the fiducial marks 18 and the alignment features 18' may be used to align the wafers.

Figure 3B:
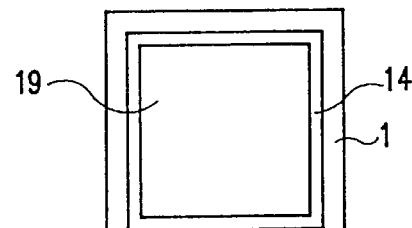
FIG. 3b is a top view illustrating an individual die on a wafer to be bonded.

FIG. 3b shows a top view of a substrate 12 to be bonded including the location of the surrounding bonding material 14 for a particular element 19. As can be seen from this top view, the bonding material 14 is to completely surround the individual optical element, indicated at 19.

For either embodiment shown in FIGS. 1 or 2, the bonding material provided either directly or using stand-offs completely seals each element to be individually utilized. Thus, when dicing a wafer in order to perform the individual elements, dicing slurry used in the dicing process is prevented from contaminating the optical elements. Thus, in addition to providing a structural component to maintain alignment and rigidity during dicing, the bonding material seal also makes the dicing a much cleaner process for the resultant integrated dies.

Figure 4A:
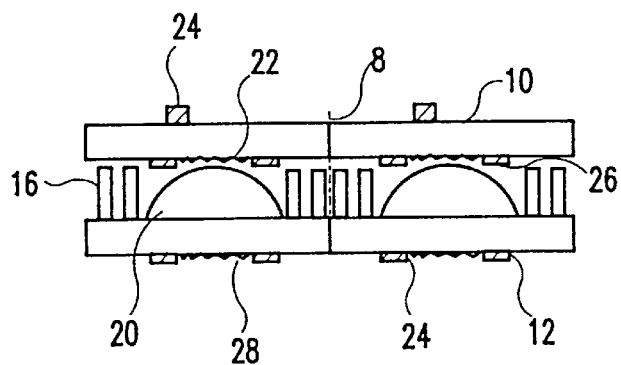
FIGS. 4A–4B illustrate specific examples of bonding two substrate together.

A specific example of integrated multiple optical elements is shown in FIG. 4A. A refractive 20 is formed on a surface of the first substrate 12. A diffractive 22 is formed on a surface of the other substrate 10. A diffractive 28 may also be formed on a bottom surface of either substrate. The stand offs 16 forming the trenches for receiving the adhesive 14 are formed at the same time as a refractive lens.

Figure 4B:
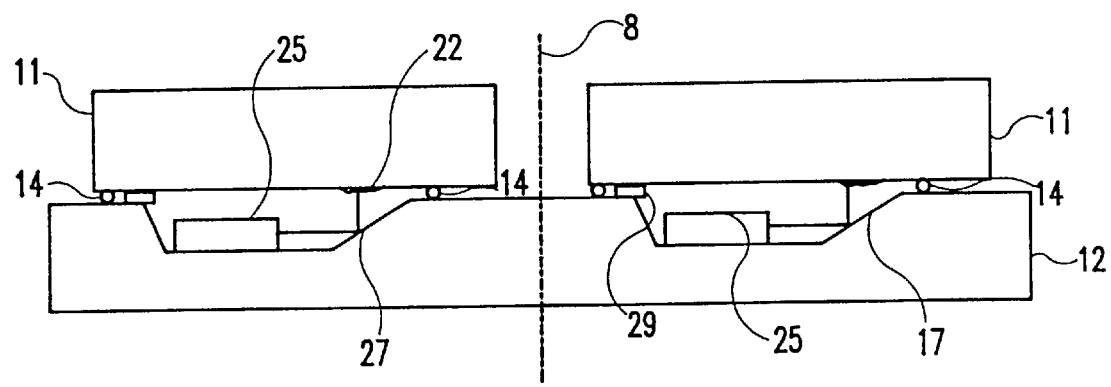

Another specific example of integrated multiple optical elements is shown in FIG. 4B. An active element 25 is provided on the first substrate 12. The first substrate 12 may be etched to provide a reflective surface 27, 17 therein. The second substrate 11, which has been separated to form dies with diffractive elements 22 thereon, may be mounted to the first substrate 12 via the adhesive 14. Stand-offs 29 may be provided to insure alignment between the reflective surface 27, 17, the active element 25 and the diffractive element 22.

When the lens 20 on the wafer 12 is directly opposite the other wafer, the vertex of the lens 20 may also be used to provide the appropriate spacing between the substrates 10 and 12. If further spacing is required, the stand offs 16 may be made higher to achieve this appropriate spacing.

In addition to using the fiducial marks 18 shown in FIG. 3a for alignment of the substrates 10, 12, the fiducial marks 18 may also be used to provide metalized pads 24 on opposite sides of the substrates rather than their bonding surfaces in order to facilitate alignment and insertion of the integrated multiple optical element into its intended end use. Such metal pads are particularly useful for mating the integrated multiple optical elements with an active or electrical element, such as in a laser for use in an optical head, a laser pointer, a detector, etc. Further, for blocking light, metal 26 may be placed on the same surface as the diffractive 22 itself using the fiducial marks 18.

Figure 5:
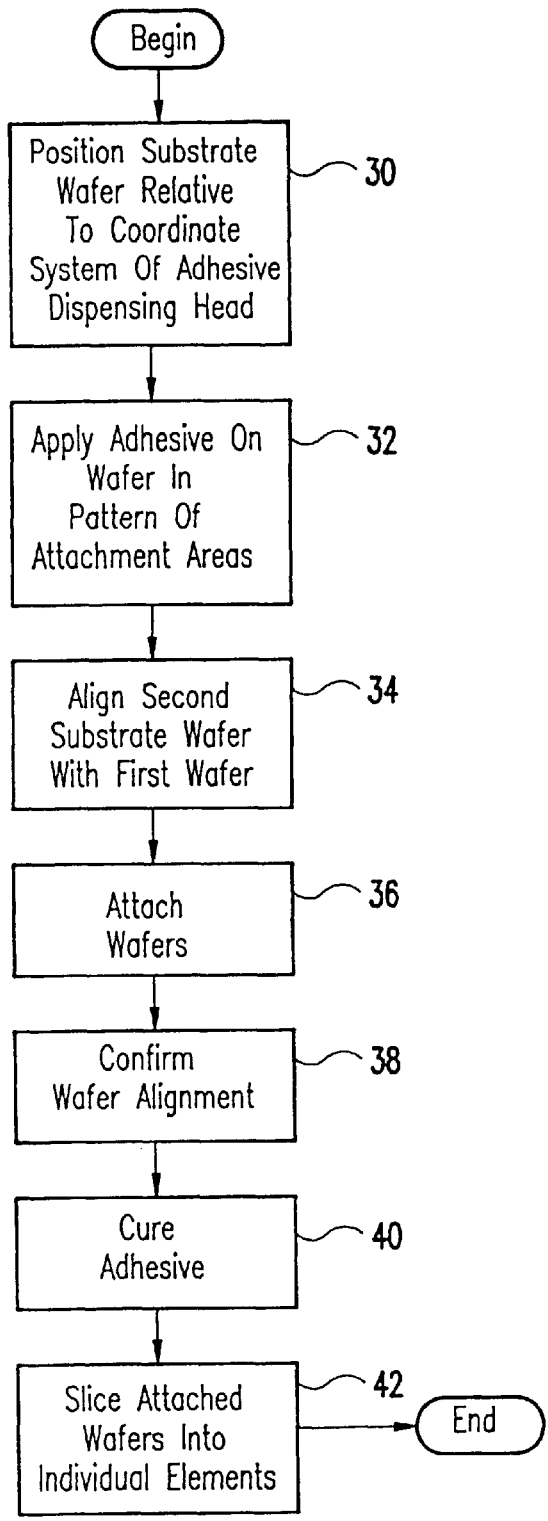
FIG. 5 is a flow chart of the bonding process of the present invention.

FIG. 5 shows a flow chart of the general process of bonding together two wafers in accordance with the present invention. In step 30, a substrate wafer is positioned relative to the bonding material to be distributed. In step 32, the bonding material is applied to the wafer in a pattern to provide sealing around the optical elements, either directly or with the stand-offs 16. In step 34, the second substrate wafer is aligned with the first substrate wafer. Just before contact is achieved, a vacuum is pulled to remove air from between the substrates. In step 36, the wafers are brought into contact. In step 38, the alignment of the two wafers is confirmed. In step 40, the adhesive is cured or the solder is reflowed and then allowed to harden. Once firmly bonded, in step 42, the bonded wafers are diced into the individual elements.

The elements to be bonded together are preferably created by direct photolithographic techniques, as set forth, for example, in U.S. Pat. No. 5,161,059 to Swanson, which is hereby incorporated by reference, for the diffractive optical elements, or in creating the spherical refractive elements by melting a photoresist as taught in O. Wada, "Ion-Beam Etching of InP and its Application to the Fabrication of High Radiance InGAsP/InP Light Emitting Diodes," General Electric Chemical Society, Solid State Science and Technology, Vol. 131, No. 10, October 1984, pages 2373–2380, or making refractive elements of any shape employing photolithographic techniques used for making diffractive optical elements when the masks used therein are gray scale masks such as high energy beam sensitive (HEBS) or absorptive gray scale masks, disclosed in provisional application Ser. No. 60/041,042, filed on Apr. 11, 1997, which is hereby incorporated by reference.

Figure 6B:
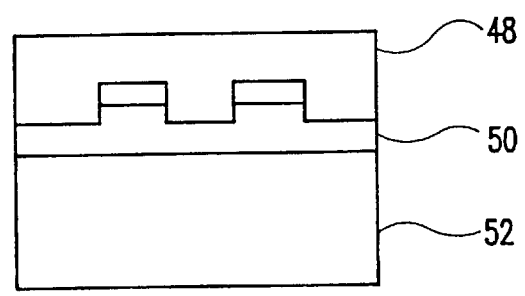
FIG. 6 illustrates a surface to be embossed by a master element in wafer form.
Figure 6A:
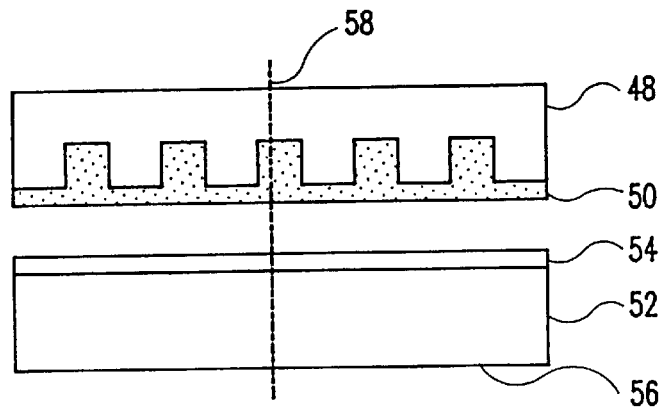

Alternatively, these photolithographic techniques may be used to make a master element 48 in glass which in turn may then be used to stamp out the desired element on a wafer level in a layer of embossable material 50 onto a substrate 52 as shown in FIG. 6. The layer 50 is preferably a polymer, while the substrate 52 is can be glass, e.g., fused silica, or plastic, preferably polycarbonate or acrylic. The polymer is preferably a UV curable acrylate photopolymer having good release from a master and good adherence to a substrate such that it does not crack after cure or release from the substrate during dicing. Suitable polymers include PHILIPS type 40029 Resin or GAFGARD 233. Dashed lines 58 indicate the dicing lines for forming an individual integrated element from the wafer.

In the embodiment shown in FIG. 6, the layer of embossable material 50 is provided on the master element 48. A layer of adhesion promoter 54 is preferably provided on the substrate 52 and/or a layer of a release agent is provided on the master element 48 in between the master element and the embossing material. The use of an adhesion promoter and/or release agent is of particular importance when the master and the substrate are of the same material or when the master naturally has a higher affinity for adhesion to the embossable material.

The type of adhesion promoter used is a function of the photopolymer to be used as the embossable material, the master material and the substrate material. A suitable adhesion promoter for use with a glass substrate is HMDS (hexamethyl disilizane). This adhesion promoter encourages better bonding of the embossable material onto the substrate 52, which is especially critical when embossing on the wafer level, since the embossed wafer is to undergo dicing as discussed below.

The provision of the embossable layer 50 on the master 48 and of the adhesion promoting layer 54 on the substrate 52 advantageously provides smooth surfaces which are to be brought into contact for the embossing, making the elimination of air bubbles easier as noted below. The provision of the embossable layer on the master 48 also provides a convenient mechanism for maintaining alignment of contacted, aligned wafer which have not been bonded, as discussed below.

If either the substrate or the master is made of plastic, it is preferable to place the polymer on the other non-plastic component, since plastic absorbs strongly in the UV region used for activating the polymer. Thus, if the UV radiation is required to pass through plastic, a higher intensity beam will be required for the desired effect, which is clearly less efficient.

The use of embossing on the wafer level is of particular interest when further features are to be provided on the wafer using lithographic processes, i.e., material is selecting added to or removed from the wafer. Such further features may include anti-reflective coatings or other features, e.g. metalization pads for aligning the die diced from the substrate 52 in a system, on the embossed layer. Any such features may also be lithographically provided on an opposite surface 56 of the substrate 52.

Typically an anti-reflective coating would be applied over the entire surface, rather than selectively. However, when using both an anti-reflective coating and metal pads, the metal would not adhere as well where the coating is present and having the coating covering the metal is unsatisfactory. Further, if the wafer is to be bonded to another wafer, the bonding material would not adhere to the surface of having such an anti-reflective coating, thereby requiring the selective positioning of the coating.

For achieving the alignment needed for performing lithographic processing in conjunction with the embossing, fiducial marks as shown in FIG. 3 may be provided on both the substrate 52 and the master 48. When performing lithographic processing, the alignment tolerances required thereby make glass more attractive for the substrate than plastic. Glass has a lower coefficient of thermal expansion and glass is flatter than plastic, i.e., it bows and warps less than plastic. These features are especially critical when forming elements on a wafer level.

When placing the master on the substrate, the wafer cannot be brought straight down into contact. This is because air bubbles which adversely affect the embossed product would be present, with no way of removing them. Therefore, in bringing the master into contact with the substrate, the master initially contacts just on one edge of the substrate and then is rotated to bring the wafer down into contact with the substrate. This inclined contact allows the air bubbles present in the embossable material to be pushed out of the side. Since the master is transparent, the air bubbles can be visually observed, as can the successful elimination thereof. As noted above, it is the presence of these air bubbles which make it advantageous for the surfaces to be brought into contact be smooth, since the diffractive formed on the surface of the master 48 could trap air bubbles even during such inclined contact.

The degree of the inclination needed for removing the air bubbles depends on the size and depth of the features being replicated. The inclination should be large enough so that the largest features are not touching the other wafer across the entire wafer on initial contact.

Alternatively, if the replica wafer is flexible, the replica wafer may be bowed to form a slightly convex surface. The master is then brought down in contact with the replica wafer in the center and then the replica wafer is released to complete contact over the entire surface, thereby eliminating the air bubbles. Again, the amount of bow required is just enough such that the largest features are not touching the other wafer across the entire wafer on initial contact.

When using the fiducial marks themselves to align the master element 48 to the glass substrate 52 in accordance with the present invention, a conventional mask aligner may be used in a modified fashion. Typically in a mask aligner, a mask is brought into contact with a plate and then a vacuum seals the mask and plate into alignment. However, a vacuum cannot be created when a liquid, such as a polymer, embossable material is on top of a wafer. Therefore, the above inclined contact is used. Once contact is established, the wafers are aligned to one another in a conventional fashion using the fiducial marks before being cured.

Further, the intensity required to cure the polymer is very high, e.g., 3–5 $W/cm^2$, and needs to be applied all at once for a short duration, e.g., less than 30 seconds. If enough energy and intensity are not applied at this time, hardening of the polymer can never be achieved. This is due to the fact that the photoinitiators in the polymer may be consumed by such incomplete exposure without full polymerization.

However, it is not easy to provide such a high intensity source with the mask aligner. This is due both to the size and the temperature of the high energy light source required. The heat from the high energy source will cause the mask aligner frame to warp as it is exposed to thermal variations. While the mask aligner could be thermally compensated or could be adapted to operate at high temperatures, the following solution is more economical and provides satisfactory results.

In addition to the inclined contact needed for placing the master in full contact with the substrate in the mask aligner, once such full contact is achieved, rather than curing the entire surface, a delivery system, such as an optical fiber, supplies the radiation from a UV source to the master-substrate in contact in the mask aligner. The delivery system only supplies UV radiation to individual spots on the polymer.

The delivery system is small enough to fit in the mask aligner and does not dissipate sufficient heat to require redesign of the mask aligner. When using an optical fiber, these spots are approximately 2 mm. Alternatively, a UV laser which is small and well contained, i.e., does not impose significant thermal effects on the system, may be used.

The delivery system provides the radiation preferably to spots in the periphery of the wafer in a symmetric fashion. For a 4 inch wafer, only about 6–12 spots are needed. If additional spots are desired for increased stability, a few spots could be placed towards the center of the wafer. These spots are preferably placed in the periphery and a minimal number of these spots is preferably used since an area where a tack spot is located does not achieve as uniform polymerization as the areas which have not been subjected to the spot radiation.

These tack spots tack the master in place with the substrate. The illumination used for curing the tack spots is only applied locally and there are few enough of these tack spots such that the area receiving the illumination is small enough to significantly affect the rest of the embossable material. Once alignment has been achieved and the master tacked into place, the substrate-master pair is removed from the aligner and then cured under the high intensity UV source over the entire surface for full polymerization. The tack spots prevent shifting of the alignment achieved in the mask aligner, while allowing the substrate-master pair to be removed from the mask aligner to thereby use the high energy light source external to the mask aligner for curing the polymer.

Alternatively, the fiducial marks may be used to form mechanical alignment features on the perimeter of the surfaces to be contacted. The mechanical alignment features may provide alignment along any axis, and there may be more than one such mechanical alignment feature. For example, the stand-offs in FIG. 4 are for aligning the wafers along the y axis, while the metal pads provide alignment of the wafer pair to additional elements along the x and z axes. The alignment features are preferably formed by the embossing itself.

The embossing and the lithographic processing on the opposite surface may be performed in either order. If the embossing is performed first, it is advantageous to leave the master covering the embossed layer until the subsequent processing on the opposite surface is complete. The master will then act as a seal for the embossed structure, protecting the polymer from solvents used during lithographic processing and keeping the features accurate throughout heating during lithographic processing.

If the lithographic processing is performed first, then more precise alignment is required during embossing to provide sufficient alignment to the photolithographic features than is required during normal embossing. Thus, embossing equipment is not set up to perform such alignment. Then, the above alignment techniques are required during embossing.

Once all desired processing has been completed, the wafer is diced to form the individual elements. Such dicing places mechanical stresses on the embossed wafer. Therefore, full polymerization and sufficient adhesion of the embossed portion to the substrate is of particular importance so that the embossed portion does not delaminate during dicing. Therefore, care must be taken in selecting the particular polymer, an adhesion promoter, and the substrate, and how these elements interact. Preferably, in order to avoid delamination of the embossed layer during dicing, the adhesion of the polymer to the substrate should be approximately 100 grams of shear strength on a finished die.

When both wafers to be bonded together as shown in FIGS. 1–4 have been embossed with a UV cured polymer, the typical preferred use of a UV epoxy for such bonding may no longer be the preferred option. This is because the UV cured polymer will still highly absorb in the UV region, rendering the available UV light to cure the epoxy extremely low, i.e., in order to provide sufficient UV light to the epoxy to be cured, the intensity of the UV light needed is very high. Therefore, the use of thermally cured resin to bond such wafers is sometimes preferred.

Alternatively, polymer on the portions not constituting the elements themselves may be removed, and then the UV epoxy could be employed in these cleared areas which no longer contain the UV polymer to directly bond the glass substrate wafer having the UV polymer with another wafer. A preferably way to remove the polymer includes provides a pattern of metal on the master. This metal blocks light, thereby preventing curing of the polymer in the pattern. When a liquid polymer is used, this uncured polymer may then be washed away. Other materials, such as the UV epoxy for wafer-to-wafer bonding or metal for active element attachment or light blocking, may now be placed where the polymer has been removed.

Figure 7:
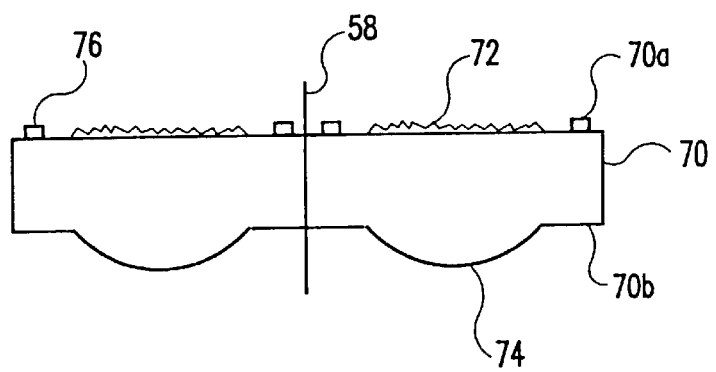
FIG. 7 illustrates a wafer on which optical elements have been formed on both sides.

In addition to the bonding of the two substrates shown in FIGS. 1–4, the alignment marks may be used to produce optical elements on the other side of the substrate itself, at shown in FIG. 7. The creation may also occur by any of the methods noted above for creating optical elements. The double sided element 70 in FIG. 7 has a diffractive element 72 on a first surface 70a thereof and a refractive element 74 on a second surface 70b thereof, but any desired element may be provided thereon. Again, metal pads 76 may be provided through lithographic processing on the hybrid element.

Figure 8:
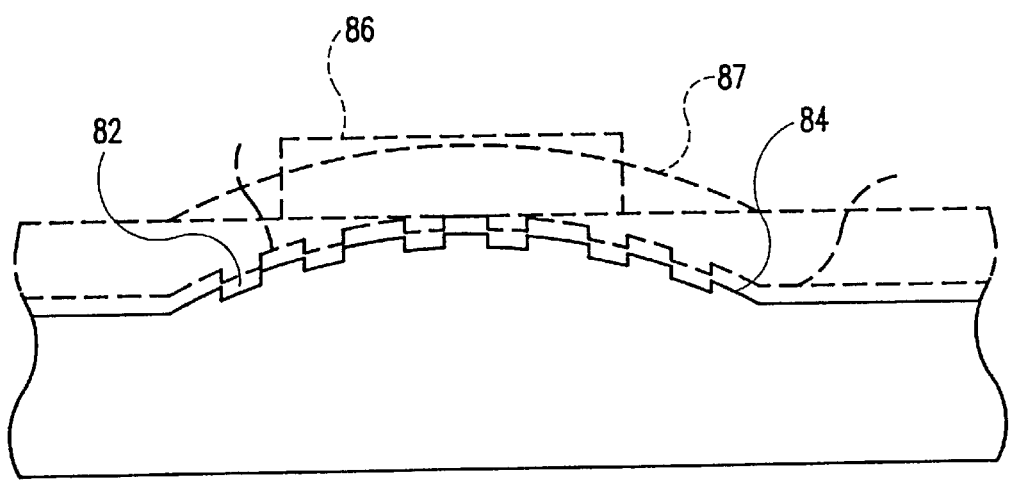
FIG. 8 is a cross-sectional view of a substrate having a hybrid element consisting of a microlens with a diffractive element integrated directly thereon.

A further configuration of an integrated multiple optical elements is shown in FIG. 8, in which a diffractive element 82 is formed directly on a refractive element 84. The refractive element may be made by any of the above noted photolithographic techniques. In the specific example shown in FIG. 8, the refractive element is formed by placing a circular layer of photoresist 86 on a surface of optical material using a mask. The photoresist is then partially flowed using controlled heat so that the photoresist assumes a partially spherical shape 87. Thereafter, the surface is etched and a refractive element 84 having substantially the same shape as the photoresist 87 is formed by the variable etch rate of the continually varying thickness of the photoresist 87. The microlens 84 is then further processed to form the diffractive element 82 thereon. The diffractive element may be formed by lithographic processing or embossing.

The wafers being aligned and bonded or embossed may contain arrays of the same elements or may contain different elements. Further, when alignment requirements permit, the wafers may be plastic rather than glass. The integrated elements which are preferred to be manufactured on the wafer level in accordance with the present invention are on the order of 100 microns to as large as several millimeters, and require alignment accuracies to ±1–2 microns, which can be achieved using the fiducial marks and/or alignment features of the present invention.

When the optical elements are provided on opposite surfaces of a substrate, rather than bonded facing one another, tolerable alignment accuracies are ±10 microns. This is due to the fact that when light is transmitted through the thickness of the glass, slight amounts of tilt can be corrected or incorporated.

As an alternative to the fiducial marks used for passive alignment, the fiducial marks may be used to create mechanical alignment features, such as corresponding groves joined by a sphere, metalization pads joined by a solder ball, and a bench with a corresponding recess. Only a few of these alignment features is needed to align an entire wafer.

All of the elements of the present invention are advantageously provided with metalized pads for ease of incorporation, including alignment, into a system, typically including active elements. The metalized pads may efficiently be provided lithographically on the wafer level.

The invention being thus described, it would be obvious that the same may be varied in many ways. Such variations are not regarded as a departure from the spirit and scope of the invention, and such modifications as would be obvious to one skilled in the art are intended to be included within the scope of the following claims.

What is claimed is:

1. A method for forming an optical element comprising:
   providing an array of first optical elements on a first wafer;
   aligning a second wafer with the first wafer;
   securing the aligned first and second wafer; and
   separating the secured wafers, each resulting secured die containing at least one of the first optical elements, wherein, during said securing, a seal is formed sufficiently around each said die during such that each at least one of the first optical elements is protected during said separating from by-products of said separating by the seal.

2. The method as recited in claim 1, wherein said aligning step includes aligning fiducial features on each of the wafers to one another.

3. The method as recited in claim 1, further comprising, prior to said securing, lithographically manufacturing the optical elements.

4. The method as recited in claim 1, further comprising, prior to said securing, replicating the optical elements using a master to emboss the optical elements into a polymer on a wafer.

5. The method as recited in claim 1, further comprising, prior to said aligning, precisely providing stand offs on said first wafer in order to ensure an appropriate gap between said first and second wafers.

6. The method as recited in claim 1, wherein the securing material is UV cured epoxy and said securing includes curing said epoxy.

7. The method as recited in claim 1, wherein the securing material is solder and said securing includes reflowing and hardening the solder.

8. The method according to claim 1, further comprising separating using a dicing slurry wherein the seal provides sufficient sealing so that the dicing slurry is prevented from entering the gap between the wafers.

9. The method as recited in claim 1, further comprising providing metallized pads on a surface of at least one of the first and second wafers opposite said secured surface for assisting, bonding and aligning the optical elements with active elements.

10. The method as recited in claim 1, further comprising providing stand-offs on said first wafer, said stand-offs surrounding each first optical element.

11. The method as recited in claim 10, further comprising providing solder on top of said stand-offs.

12. The method as recited in claim 10, further comprising providing a liquid adhesive in a channel formed by said stand-offs.

13. The method as recited in claim 1, further comprising providing alignment areas on each said first element for bonding with active elements.

14. The method as recited in claim 1, further comprising providing fiducial marks on said first and second wafers.

15. The method of claim 1, wherein the second wafer contains an array of second optical elements.

16. The method of claim 1, wherein the dicing by-products include a dicing slurry.

17. The method of claim 15, wherein said securing includes providing bonding material around each said second optical element in the array of second optical elements on the second wafer.

18. The method of claim 1, wherein the method further includes providing a bonding material around at least a periphery of each said die.

19. The method of claim 1, wherein said securing includes providing stand-offs between dies.

20. The method of claim 19, wherein said securing further comprising providing bonding material on said stand-offs.

21. The method of claim 19, wherein said providing stand-offs includes forming stand-offs in one of said first and second wafers.

22. The method of claim 21, wherein said stand-offs are formed on the first wafer.

23. The method of claim 22, wherein said forming stand-offs occurs at a same time as said providing of the array of first optical elements.

24. The method of claim 22, wherein said forming stand-offs includes etching one of said first and second wafers.

25. The method of claim 22, wherein said forming stand-offs includes replicating stand-offs.

26. The method of claim 19, wherein said providing stand-offs includes providing a channel in said stands offs for receiving bonding material.

27. The method of claim 26, wherein the bonding material is an adhesive.

28. The method of claim 18, wherein the bonding material is an adhesive.

29. The method of claim 18, wherein the bonding material is a solder.

\* \* \* \* \*